United States Patent
Cafaro et al.

(10) Patent No.: US 6,897,687 B2
(45) Date of Patent: May 24, 2005

(54) METHOD AND APPARATUS FOR RECONFIGURABLE FREQUENCY GENERATION

(75) Inventors: Nicholas Cafaro, Coconut Creek, FL (US); Robert Stengel, Pompano Beach, FL (US)

(73) Assignee: Motorola, Inc., Schaumburg, IL (US)

( * ) Notice: Subject to any disclaimer, the term of this patent is extended or adjusted under 35 U.S.C. 154(b) by 147 days.

(21) Appl. No.: 10/382,696

(22) Filed: Mar. 6, 2003

(65) Prior Publication Data

US 2004/0174192 A1 Sep. 9, 2004

(51) Int. Cl.[7] .............................................. H03B 21/00
(52) U.S. Cl. ...................................................... 327/105
(58) Field of Search ................................ 327/105–107, 327/113–117; 331/19; 341/143, 157; 375/365–368, 237–239, 130; 708/271, 276–277, 290, 301

(56) References Cited

U.S. PATENT DOCUMENTS

| | | | | |
|---|---|---|---|---|
| 5,430,764 A | * | 7/1995 | Chren, Jr. | 375/308 |
| 5,488,627 A | | 1/1996 | Hardin et al. | |
| 5,521,533 A | * | 5/1996 | Swanke | 327/107 |
| 5,864,492 A | * | 1/1999 | Sadot | 708/270 |
| 6,753,706 B2 | * | 6/2004 | Ho | 327/105 |

* cited by examiner

Primary Examiner—My-Trang Nu Ton

(57) ABSTRACT

A frequency generator (10) includes a direct digital synthesizer (14) having an accumulator (18 or 28) for providing an interim output and a digital interpolator (16) for interpolating the interim output to provide an output signal with reduced electromagnetic interference. The digital interpolator can include at least one converter among a digital-to-phase converter (22) or a digital-to-time converter (32). The frequency generator can further include a digitally programmable spreading function (12) applied to an input of the direct digital synthesizer.

22 Claims, 6 Drawing Sheets

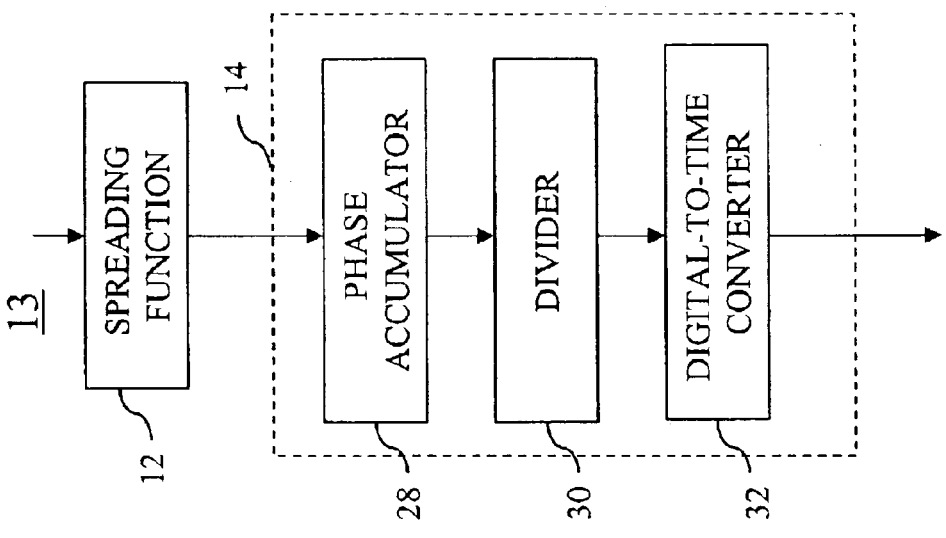
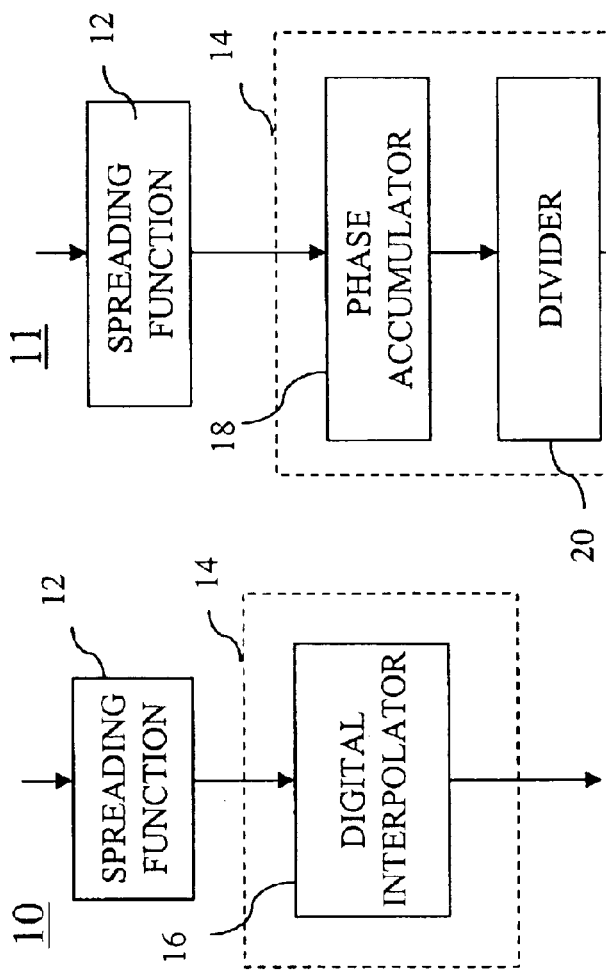

150

METHOD AND APPARATUS FOR RECONFIGURABLE FREQUENCY GENERATION

CROSS-REFERENCE TO RELATED APPLICATIONS

Not applicable

FIELD OF THE INVENTION

This invention relates generally to frequency generators, and more particularly to a method and system for implementing a reconfigurable frequency generator using direct digital synthesis utilizing digital-to-phase or digital-to-time conversion.

BACKGROUND OF THE INVENTION

Many electronic devices employ microprocessors or other digital circuits which require one or more clock signals for synchronization. A clock signal permits the precise timing of events in the microprocessor, for example. Typical microprocessors may be supervised or synchronized by a free-running oscillator, such as driven by a crystal, an LC-tuned circuit, or an external clock source. Clocking rates up to and beyond 200 MHz are common in personal computers. The parameters of a clock signal are typically specified for a microprocessor and may include minimum and maximum allowable clock frequencies, tolerances on the high and low voltage levels, maximum rise and fall times on the waveform edges, pulse-width tolerance if the waveform is not a square wave, and the timing relationship between clock phases if two-clock phase signals are needed.

Many clocks used by today's digital circuits are usually square waves with short rise and fall times. Unfortunately, high performance, microprocessor-based devices using leading edge, high speed circuits are particularly susceptible to generating and radiating electromagnetic interference (EMI). The spectral components of the EMI emissions typically have peak amplitudes at harmonics of the fundamental frequency of the clock circuit. Radiated power from signal traces that distribute these clocks can have adverse affects on adjacent circuits. Acccordingly, many regulatory agencies, such as the FCC in the United States, have established testing procedures and maximum allowable emissions for such products.

In order to comply with such government limits on EMI emissions, costly suppression measures or extensive shielding may be required. Other approaches for reducing EMI include careful routing of signal traces on printed circuit boards to minimize loops and other potentially radiating structures. Unfortunately, such an approach often leads to more expensive multilayer circuit boards with internal ground planes. In addition, greater engineering effort must go into reducing EMI emissions. The difficulties caused by EMI emissions are made worse at higher processor and clock speeds.

Conventional ROM-based implementations using a spread spectrum clock generator uses voltage controlled oscillators and phase-locked loops as shown in U.S. Pat. No. 5,488,627 by Hardin et al. These are analog implementations that amount to modulating a VCO in a way similar to many communication systems and fail to provide the required reduction in chip area and power consumption needed in today's communication and computer applications. Furthermore, existing ROM-based implementations fail to provide continuous and glitchless operation of an output signal when applying, removing, or altering the spreading function. Many existing systems fail to tolerate abrupt clock signal variations.

SUMMARY OF THE INVENTION

A method and apparatus for reducing EMI can be achieved by reducing the peak amplitude of the signal at a specific frequency by spreading its energy over a wider bandwidth or frequency range. A spreading function can be applied to a direct digital synthesizer that can use digital-to-phase or digital-to-time conversion. The spreading function can be digitally programmable and can be implemented in a variety of forms. The spreading function allows the output spectrum to be shaped in such a way to optimize system performance and/or meet FCC emissions standards. Additionally, the spreading function can be applied, removed, or altered without interrupting operation of the output signal. This continuous, glitchless operation provides a great advantage in applications where abrupt clock signal variations can not be tolerated. The present invention can be applied to systems requiring clock signals that must be distributed to subsystems via transmission lines such as personal computers and workstations that supply clock signals to microprocessors, memory elements, etc. by routing signal traces on the systems main board. Allowing digitally programmable spreading of clock signals can allow optimization of an entire system—sometimes referred to as "system margining".

In one aspect of the present invention, a frequency generator can comprise a direct digital synthesizer having an accumulator for providing an interim output and a digital interpolator for interpolating the interim output to provide an output signal with reduced electromagnetic interference. The digital interpolator can comprise at least one converter among a digital-to-phase converter or a digital-to-time converter. The frequency generator can further comprise a digitally programmable spreading function applied to an input of the direct digital synthesizer.

In a second aspect of the present invention, a frequency generator providing an output signal with reduced electromagnetic interference comprises a ROM-less direct digital synthesizer and a digitally programmable spreading function applied to an input of the direct digital synthesizer.

In a third aspect of the present invention, a method of mitigating electromagnetic interference comprises the steps of modulating an input control word to provide a modulated input control word to an accumulator, processing a residue from the accumulator by dividing the residue by the modulated input control word to provide a ratio indicating a delay between an edge of a system clock and a desired rising edge of an output signal, and delaying the output signal by digitally interpolating the ratio using at least one among digital-to-phase conversion and digital-to-time conversion to provide the delay.

In a fourth aspect of the present invention, a method of mitigating electromagnetic interference comprises the steps of applying a spreading function to an input signal to provide a modulated signal. In a ROM-less direct digital synthesizer, the method further comprises the steps of accumulating the modulated signal to provide a residue, dividing the residue by the input signal to provide a ratio, and digitally interpolating the ratio

BRIEF DESCRIPTION OF THE DRAWINGS

FIG. 1 is a block diagram of a frequency generator having a spreading function and a digital interpolator in accordance with the present invention.

FIG. 2 is a more detailed block diagram of the frequency generator of FIG. 1.

FIG. 3 is a block diagram of an alternative embodiment of FIG. 1.

DETAILED DESCRIPTION OF THE DRAWINGS

Figure 4:
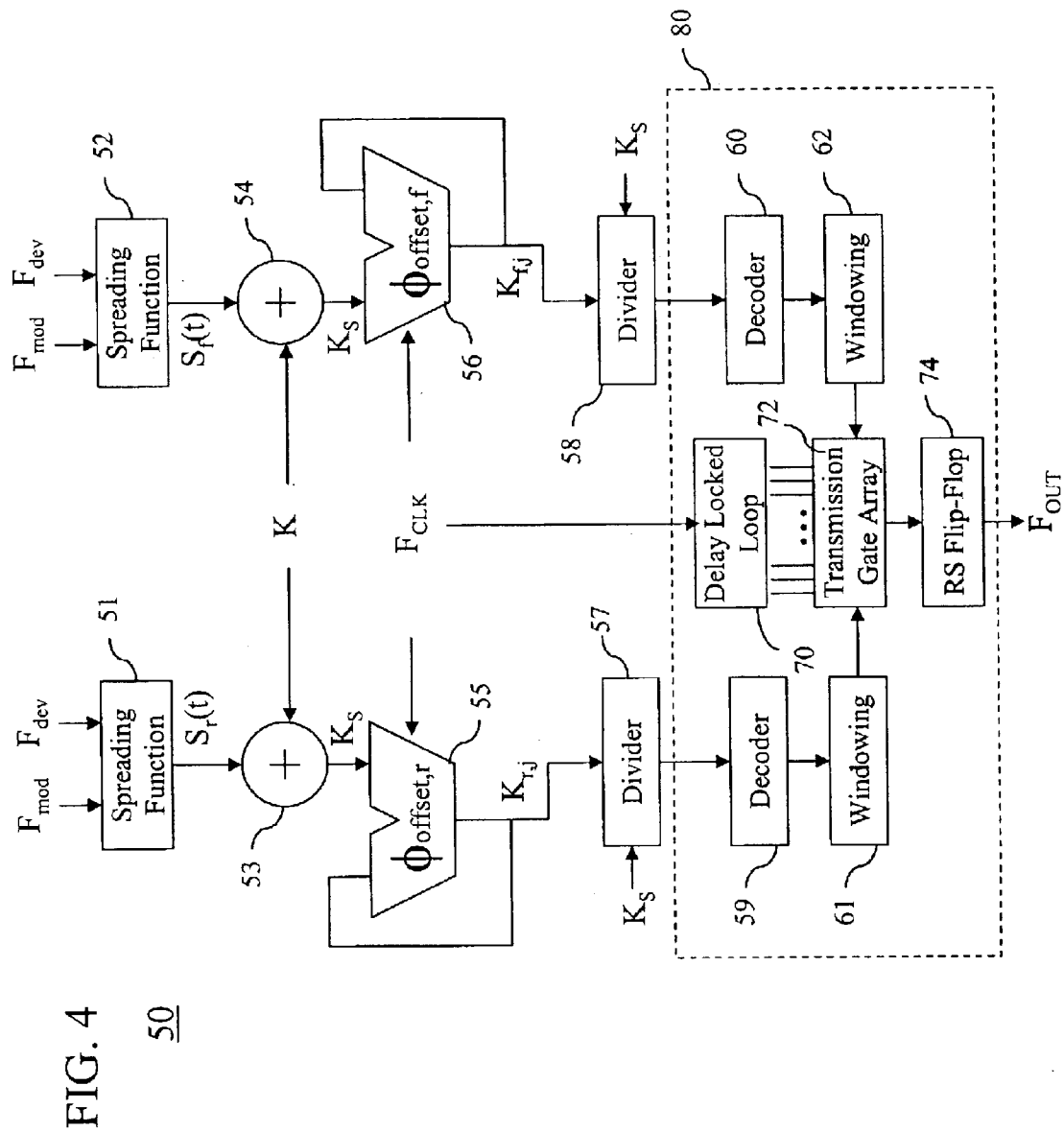
FIG. 4 is a more detailed block diagram of the frequency generator of FIGS. 1 and 2.

Referring to FIG. 1, there is shown a block diagram of a frequency generator 10 that can provide an output signal with reduced EMI. The frequency generator can comprise a direct digital synthesizer (DDS) 14 and a digitally programmable spreading function 12 applied to an input of the DDS 14. The direct digital synthesizer can preferably be a ROM-less DDS having at least a digital interpolator 16. In one embodiment as shown in FIG. 2, a frequency generator 11 can include the digitally programmable spreading function 12 and a DDS 14 having a phase accumulator 18 for providing an interim output, a divider 20, and a digital interpolator in the form of a digital-to-phase converter 22 for interpolating the interim output to provide an output signal having reduced EMI. The frequency generator 11 reduces the peak amplitude of the signal in the frequency domain by spreading its energy over a wider bandwidth. (See FIGS. 5 and 6).

In an alternative embodiment as shown in FIG. 3, a frequency generator 13 can include the digitally programmable spreading function 12 and a DDS 14 having a phase accumulator 28 for providing an interim output, a divider 30, and a digital interpolator in the form of a digital-to-time converter 32 for interpolating the interim output to provide the reduced EMI output signal. The frequency generator 13 reduces the peak amplitude of the signal in the frequency domain by spreading its energy over a wider bandwidth. It should be noted that the frequency generators of FIGS. 1–4 can be implemented as a completely integrated digital CMOS circuit.

Referring to FIG. 4, a more detail block diagram of a frequency generator 50 is shown having a spreading function and digital interpolator similar to the frequency generator 11 of FIG. 2. More particularly, the frequency generator includes left and right branches where the left side generates rising edges and the right side generates falling edges. The rising and falling edges may be independently phase shifted to control duty cycle or phase shift the entire signal. In other words, the frequency generator 50 can include a first spreading function, a first accumulator, and a first digital interpolator for generating rising edges of the output signal and a second spreading function, a second accumulator, and a second digital interpolator for generating falling edges of the output signal, wherein the rising edges and the falling edges are independently phase shifted as further detailed below. A modulation frequency (Fmod) and a frequency deviation of modulation (Fdev) serve as inputs to a spreading function(s) 51, 52 to provide a spreading function S(t) which is combined (53, 54) with an input control word K. As a result of combining the spreading function with input control word K, a modulated input signal Ks is provided as an input to respective accumulators 55 and 56.

The accumulators produce an interim output at a frequency dependent upon the input control word. The accumulators are preferably phase accumulators having a reference clock, a frequency control word modified by the spreading function, and a fed-back interim output as inputs to the accumulators. Accumulators 55 and 56 are both controlled by system clock Fclk. In addition to the modulated input signal Ks, the accumulator 55 has a feedback loop feeding back a residue or overflow signal Krj as a second input to accumulator 55 for the rising edges. Likewise, accumulator 56 has a feedback loop feeding back a residue or overflow signal Kfj as a second input to accumulator 56 for the falling edges. The residue signal Kj (or Krj and Kfj) can be divided by the modulated input signal Kj to provide a ratio that is related to the output clock or output signal, namely: Kj/Ks=Fout/Fclk. In this instance, a divider 57 divides the residue signal for rising edges Krj by the modulated input signal Ks and a divider 58 divides the residue signal for falling edges Kfj by the modulated input signal Ks to provide the ratio for use by an interpolator 80. The interpolator 80 can comprise a frequency domain interpolator having the digital-to-phase converter and a delay-locked loop as shown in FIGS. 2 and 4 or alternatively a time domain interpolator having a digital-to-time converter as shown in FIG. 3 and a delay-locked loop.

The interpolator 80 in an embodiment for reducing the peak amplitude of the output signal in the time domain as shown in FIG. 4 preferably includes a digital-to-phase converter in the form of decoders 59 and 60 and windowing functions 61 and 62 for rising and falling edges respectively. The windowing functions 61 and 62 preferably serve to provide an input to a transmission gate array 72. The decoders and windowing functions serve the function of picking the appropriate signal from the appropriate N-tap delay line from delay locked loop 70. The total delay of the tapped delay line is matched to the system clock using the delay-locked loop, resulting in stable interpolation under process or temperature variations. The interpolator 80 can also comprise an RS Flip-Flop 74 at the output of the transmission gate array 72 to process rising and falling edges for the output signal Fout.

Figure 5:
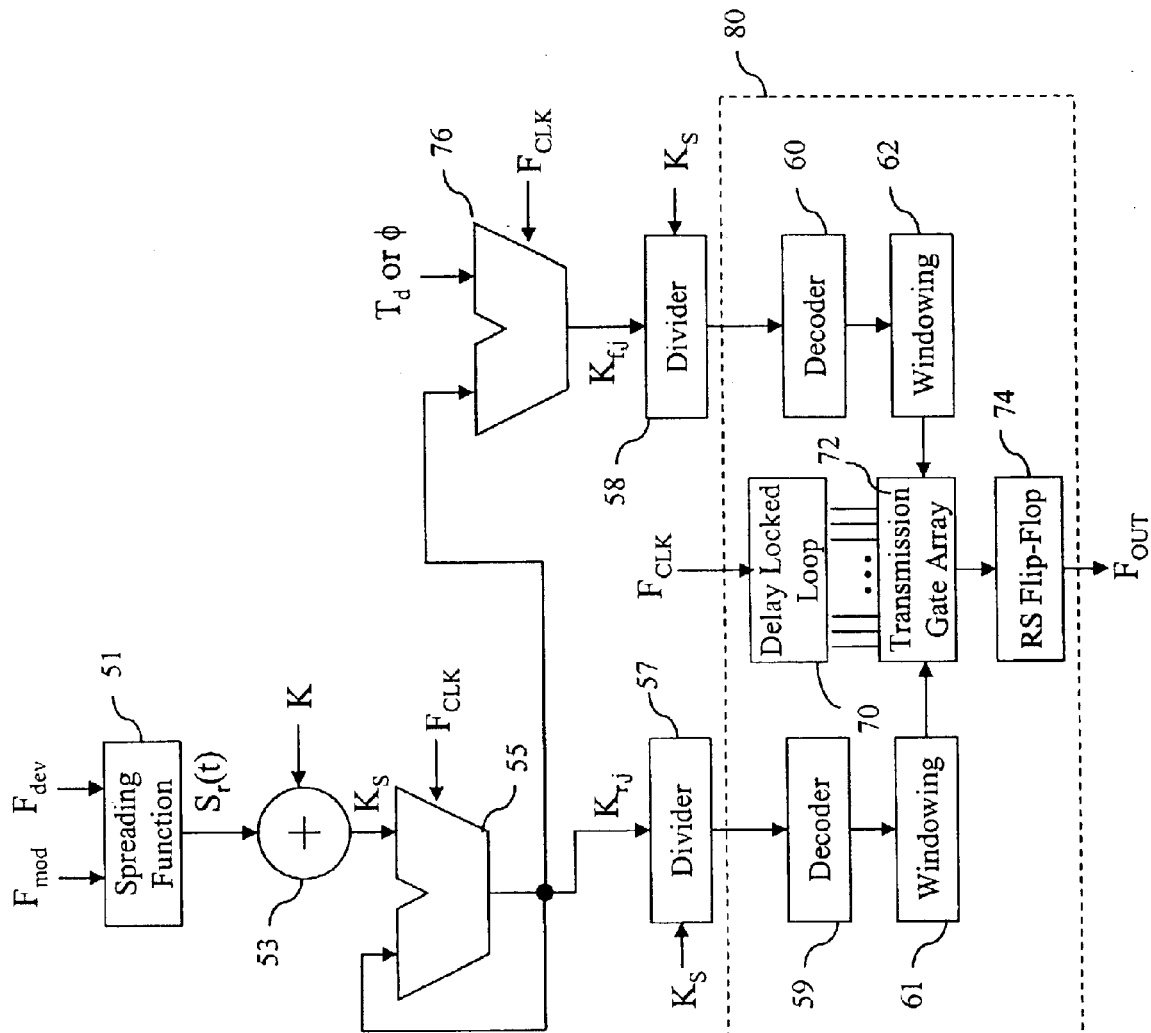
FIG. 5 is a detailed block diagram of an alternative frequency generator in accordance with the present invention.
Figure 6:
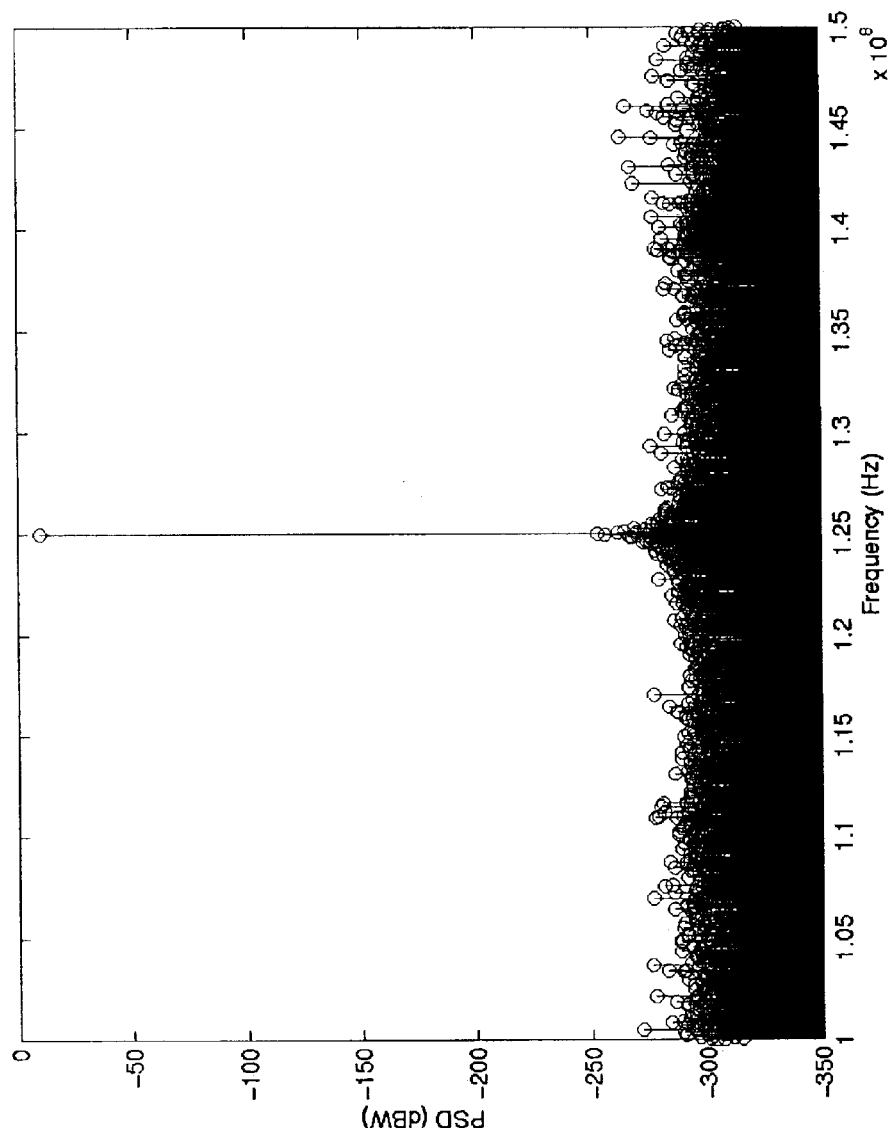
FIG. 6 is a chart illustrating the power spectral density of a 125 MHz output without spreading.
Figure 7:
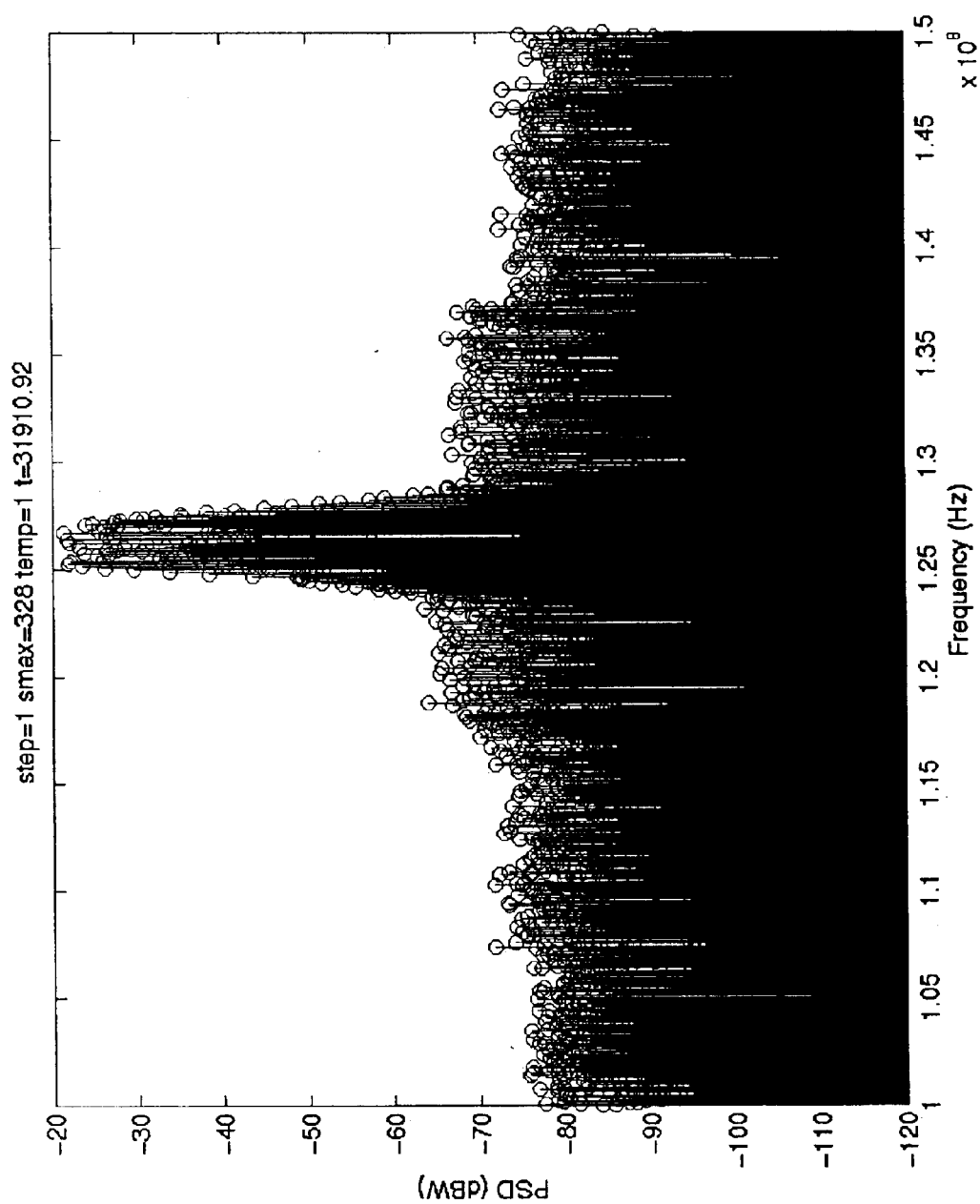
FIG. 7 is a chart illustrating the power spectral density of a 125 MHz output with spreading in accordance with the present invention.

Referring to FIG. 5, a frequency generator 150 representing an alternative embodiment to the frequency generator 50 of FIG. 4 is shown utilizing a single accumulator and spreading function. Frequency generator 150 can use substantially the same components as frequency generator 50 except that a phase/time offset summer device 76 is used before the divider 58 as shown. Frequency generator 150 can accomplish the same function as frequency generator 50 using a single spreading function 51 and a single accumulator 55 to generate both the rising and failing edges. More particularly, the frequency generator 150 can include a single spreading function, a single accumulator, and a digital interpolator 80 for generating rising edges of the output signal and for generating falling edges of the output signal using the phase offset summer 76, where the rising edges and the falling edges are phase offset relative to each other. A modulation frequency (Fmod) and a frequency deviation of modulation (Fdev) serve as inputs to a spreading function 51 to provide a spreading function S(t) which is combined (53) with an input control word K. As a result of combining the spreading function with input control word K, a modulated input signal Ks is provided as an input to an accumulator 55.

The accumulator 55 produces an interim output at a frequency dependent upon the input control word and controlled by system clock Fclk. In addition to the modulated input signal Ks, the accumulator 55 has a feedback loop feeding back a residue or overflow signal Krj as a second input to accumulator 55. The output of the accumulator 55 provides the residue signal for the rising edges Krj while the output signal from the accumulator 55 combined (76) with a phase shift or time delay provides the residue signal for the falling edges Kfj. The residue signal Kj (or Krj and Kfj) can be divided by the modulated input signal Ks to provide a ratio that is related to the output clock or output signal, namely: Kj/Ks=Fout/Fclk. As in frequency generator 50, the frequency generator 150 includes a divider 57 that divides the residue signal for rising edges Krj by the modulated input signal Ks and a divider 58 that divides the residue signal for falling edges Kfj by the modulated input signal Ks to provide the ratio for use by an interpolator 80. Furthermore, the output may be phase shifted φ radians by adding a factor of (φ/2*pi) to the accumulator. Or the output may be time shifted Td units by adding a factor of (Td/T0) to the accumulator, where T0 is the period of the reference clock.

Figure 8:
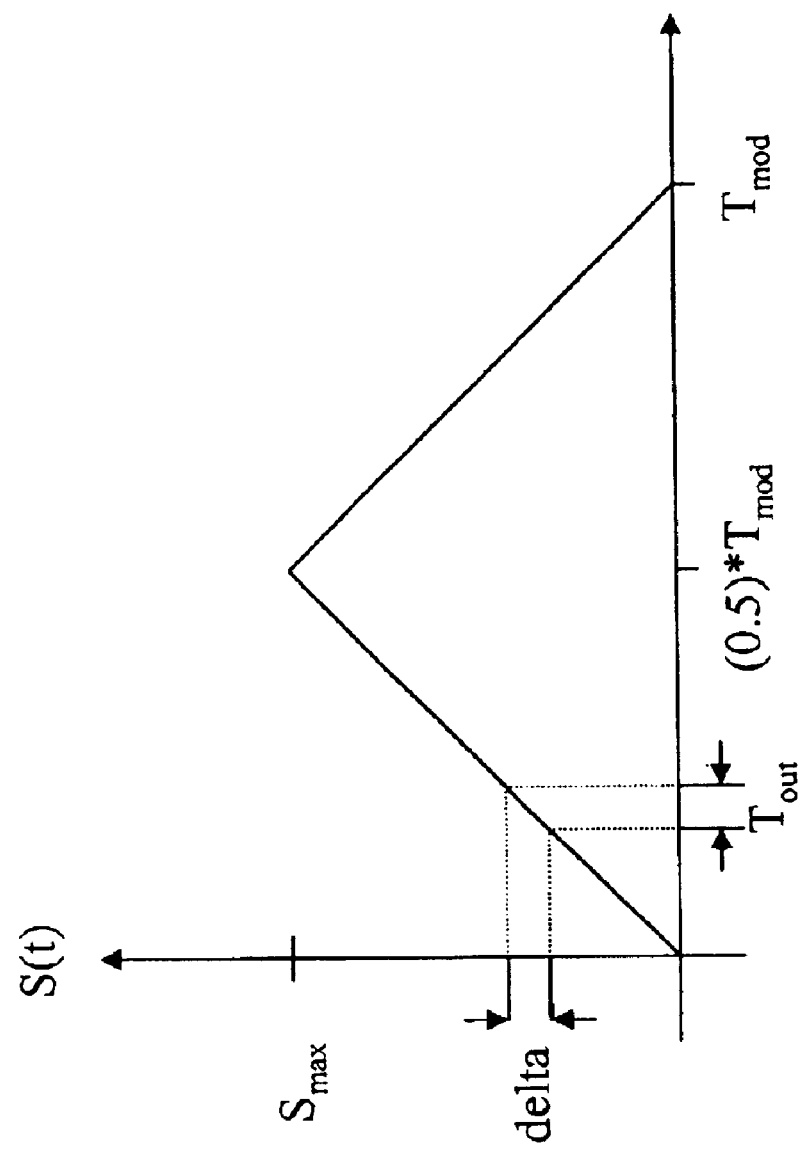
FIG. 8 is a chart illustrating a spreading function in accordance with the present invention.

Note, the spreading function S(t) may be generated by an up/down counter (not shown) that produces an exemplary waveform shown on FIG. 8. In this depiction, Fmod=(1/Tmod) and Fdev=(% Frequency Deviation*K). Furthermore, the frequency generator output in any of the examples above can be phase shifted φ radians by adding a factor of (φ/2*pi) to the accumulator or time shifted Td units by adding a factor of (Td/T0) to the accumulator, where T0 is the period of the reference clock. It should be understood that the present invention is not limited to such phase shifts or time delays, spreading functions and waveforms and that other delays, functions and corresponding waveforms could be used in accordance with the present invention.

Operationally, a frequency generator in accordance with the present invention can provide a method of mitigating electromagnetic interference by modulating an input control word to provide a modulated input control word to an accumulator and processing a residue from the accumulator by dividing the residue by the modulated input control word to provide a ratio indicating a delay between an edge of a system clock and a desired edge of an output signal. The method can further include the step of delaying the output signal by digitally interpolating the ratio using at least one among digital-to-phase conversion and digital-to-time conversion to provide the delay. The step of modulating can include the step of applying a spreading function to the input control word such as a spread spectrum function. The step of processing can further comprise the step of decoding and windowing the ratio. The method in accordance with the present invention further enables the independent phase shifting of a plurality of rising and falling edges to control a duty cycle of the output signal.

In another aspect of the present invention, a method of mitigating electromagnetic interference using a ROM-less direct digital synthesizer can simply include the steps of applying a spreading function such as a spread spectrum function to an input signal to provide a modulated signal, accumulating the modulated signal to provide a residue, dividing the residue by the input signal to provide a ratio, and digitally interpolating the ratio.

In light of the foregoing description of the invention, it should be recognized that the present invention can be realized in hardware, software, or a combination of hardware and software. A method and system for reducing EMI according to the present invention can be realized in a centralized fashion in one computer system, or in a distributed fashion where different elements are spread across several interconnected computer systems. Any kind of computer system, or other apparatus adapted for carrying out the methods described herein, is suited. A typical combination of hardware and software could be a general purpose computer system with a computer program that, when being loaded and executed, controls the computer system such that it carries out the methods described herein.

The present invention can also be embedded in a computer program product, which comprises all the features enabling the implementation of the methods described herein, and which, when loaded in a computer system, is able to carry out these methods. Computer program or application in the present context means any expression, in any language, code or notation, of a set of instructions intended to cause a system having an information processing capability to perform a particular function either directly or after either or both of the following a) conversion to another language, code or notation; b) reproduction in a different material form.

Additionally, the description above is intended by way of example only and is not intended to limit the present invention in any way, except as set forth in the following claims.

What is claimed is:

1. A frequency generator, comprising:
   a direct digital synthesizer having an accumulator for providing an interim output and a digital interpolator for interpolating the interim output to provide an output signal with reduced electromagnetic interference, wherein the digital interpolator comprises at least one converter among a digital-to-phase converter and a digital-to-time converter; and
   a digitally programmable spreading function applied to an input of the direct digital synthesizer.

2. The frequency generator of claim 1, wherein the direct digital synthesizer is a ROM-less direct digital synthesizer.

3. The frequency generator of claim 1, wherein the accumulator produces the interim output at a frequency dependent upon an input word provided as an input to the direct digital synthesizer.

4. The frequency generator of claim 3, wherein the accumulator is a phase accumulator having a reference clock as a first input, a frequency control word modified by the spreading function as a second input, and a fed-back interim output as a third input.

5. The frequency generator of claim 1, wherein the digital interpolator further comprises a divider and a tapped logic delay line.

6. The frequency generator of claim 5, wherein the digital interpolator comprises a time domain interpolator having the digital-to-time converter and a delay-locked loop.

7. The frequency generator of claim 5, wherein the digital interpolator comprises a frequency domain interpolator having the digital-to-phase converter and a delay-locked loop.

8. The frequency generator of claim 7, wherein the digital interpolator further comprises a decoder coupled between the divider and a windowing function, a transmission gate array coupled between the windowing function and delay locked loop, and a RS Flip-Flop coupled to the transmission gate array.

9. The frequency generator of claim 1, wherein the frequency generator comprises a first spreading function, a first accumulator, and a first digital interpolator for generating rising edges of the output signal and a second spreading function, a second accumulator, and a second digital Interpolator for generating falling edges of the output signal, wherein the rising edges and the falling edges are independently phase shifted.

10. The frequency generator of claim 1, wherein the accumulator, the digital interpolator and the digitally programmable spreading function generates rising edges of the output signal and a phase offset summer further enables generation of falling edges of the output signal, wherein the rising edges and the falling edges are phase offset relative to each other.

11. The frequency generator of claim 2, wherein the frequency generator is implemented as an integrated digital CMOS circuit.

12. A frequency generator providing an output signal with reduced electromagnetic interference, comprising:
 a ROM-less direct digital synthesizer; and
 a digitally programmable spreading function applied to an input of the direct digital synthesizer, wherein the ROM-less direct digital synthesizer comprises a digital interpolator having a divider and a tapped logic delay line.

13. The frequency generator of claim 12, wherein the digital interpolator comprises a time domain interpolator having a digital-to-time converter and a delay-locked loop.

14. The frequency generator of claim 12, wherein the digital interpolator comprises a frequency domain interpolator having a digital-to-phase converter and a delay-locked loop.

15. The frequency generator of claim 12, wherein the digital interpolator further comprises a decoder coupled between the divider and a windowing function, a transmission gate array coupled between the windowing function and delay locked loop, and a RS Flip-Flop coupled to die transmission gate array.

16. The frequency generator of claim 12, wherein the frequency generator comprises a first spreading function, a first accumulator, and a first digital interpolator for generating rising edges of the output signal and a second spreading function, a second accumulator, and a second digital interpolator for generating falling edges of the output signal, wherein the rising edges and the falling edges are independently phase shifted.

17. The frequency generator of claim 12, wherein the ROM-less direct digital synthesizer comprises an accumulator and a digital interpolator which along with the digitally programmable spreading function generates rising edges of an output signal of the frequency generator and wherein a phase offset summer further enables generation of falling edges of the output signal, wherein the rising edges and the falling edges are phase offset relative to each other.

18. A method of mitigating electromagnetic interference, comprising the steps of:
 modulating an input control word to provide a modulated input control word to on accumulator;
 processing a residue from the accumulator by dividing the residue by the modulated input control word to provide a ratio indicating a delay between an edge of a system clock and a desired rising edge of an output signal; and
 delaying the output signal by digitally interpolating the ratio using at least one among digital-to-phase conversion and digital-to-time conversion to provide the delay.

19. The method of claim 18, wherein the step of modulating comprises the step of applying a spreading function to the input control word.

20. The method of claim 18, wherein the step of processing further comprises the step of decoding and windowing the ratio.

21. The method of claim 18, wherein the method further comprises the step of independently phase shifting a plurality of rising and falling edges to control a duty cycle of the output signal.

22. A method of mitigating electromagnetic interference, comprising the steps of:
 applying a spreading function to an input signal to provide a modulated signal;
 in a ROM-less direct digital synthesizer:
 accumulating the modulated signal to provide a residue;
 dividing the residue by the input signal to provide a ratio; and
 digitally interpolating the ratio.

* * * * *